Figure 1:
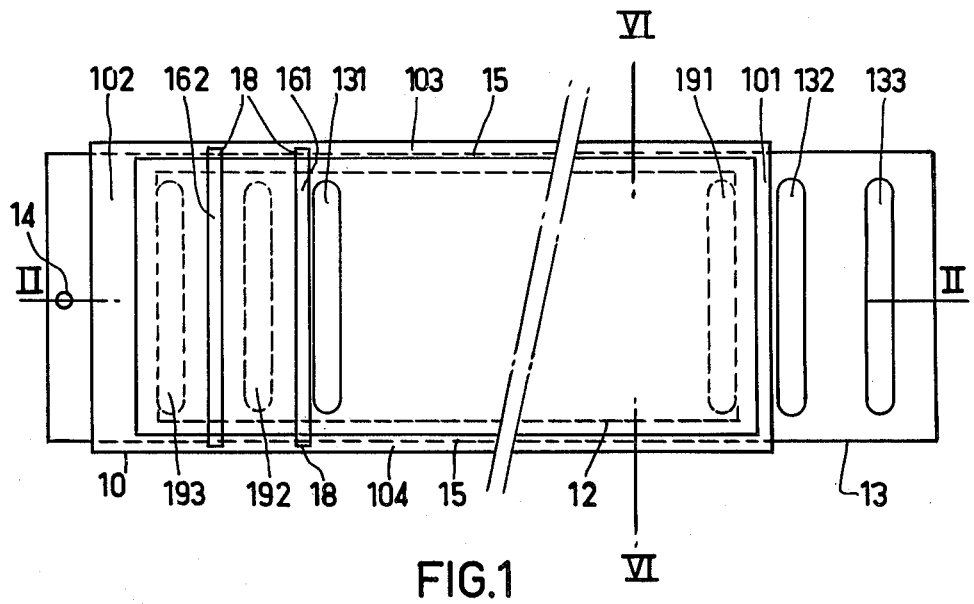

United States Patent [19]

Mahieu et al.

[11] 4,397,260
[45] Aug. 9, 1983

[54] BOAT FOR THE EPITAXIAL GROWTH OF SEVERAL LAYERS FROM THE LIQUID PHASE

[75] Inventors: Marc Mahieu, Caen; Jacques Varon, Troarn; Philippe Vandenberg, Caen, all of France

[73] Assignee: U.S. Philips Corporation, New York, N.Y.

[21] Appl. No.: 254,671

[22] Filed: Apr. 16, 1981

[30] Foreign Application Priority Data

Apr. 23, 1980 [FR] France ................................ 80 09072

[51] Int. Cl.³ .......................................... H01L 21/208
[52] U.S. Cl. .................................... 118/421; 118/429
[58] Field of Search .............. 118/412, 415, 421, 422, 118/429; 156/621, 622; 148/171, 172

[56] References Cited

U.S. PATENT DOCUMENTS 4,013,040  3/1977  Horikoshi ........................... 118/415

FOREIGN PATENT DOCUMENTS 52-56855  5/1977  Japan ................................... 118/415
54-117679 9/1979  Japan ................................... 156/622

Primary Examiner—John P. McIntosh
Attorney, Agent, or Firm—Paul R. Miller

[57] ABSTRACT

A boat for the epitaxial growth of several layers on a substrate includes reservoirs present over a slide in the boat, as well as substrates on a base plate in the boat. A fixedly arranged plate is placed between the base plate and the slide, which fixedly arranged plate and slide include communication windows for liquid solutions in the reservoirs to act on the substrates. Applications of this invention are epitaxial growth of several layers in general, and in particular, the manufacture of plates for opto-electronic semiconnector devices.

8 Claims, 10 Drawing Figures

BOAT FOR THE EPITAXIAL GROWTH OF SEVERAL LAYERS FROM THE LIQUID PHASE

The invention relates to a boat for use in a device for the epitaxial growth from the liquid phase and designed for the successive formation of at least two semiconductor layers on at least one semiconductor substrate starting from liquid solutions with the boat comprising a fixed base plate having a recess for receiving the substrate, above which at a distance a flat slide is provided for supporting liquid solutions which are distributed among reservoirs, and the slide is moved relative to the base plate through a wall of the boat.

The invention relates to epitaxial growth in general but more in particular to the growth of III-V semiconductor compounds which are difficult to obtain in an industrial manner.

The epitaxial growth from the liquid phase is a known technique. An apparatus for using this technique is described in U.S. Pat. No. 3,690,965. The apparatus described in this patent comprises three essential elements:

a reservoir in which the liquid solution is placed,
a first flat plate on which the reservoir bears and which forms the bottom thereof and
a second flat plate which is provided below the preceding one in a recess of which the semiconductor substrate to be covered is present.

The two plates can be reciprocated relative to each other and to the reservoir. The first flat plate has an aperture having a shape and cross-section substantially equal to those of the bottom of the reservoir and also substantially equal to those of the recess in which the substrate is present.

In a first step of the method of the bottom of the reservoir, the aperture and the recess are aligned. The liquid solution then covers the substrate and fills the aperture. Both plates which are connected together are then moved relative to the reservoir. The substrate in the recess and the aperture filled with a small volume of liquid solution are moved away from the reservoir and the bottom of the reservoir is closed. Starting from the small volume of liquid solution which is laterally bounded by the aperture, the growth of the epitaxial layer on the substrate is then carried out by the usual controlled decrease of temperature.

The method according to the above mentioned U.S. patent which consists of the formation of an epitaxial layer from a volume of liquid solution provided as a comparatively thin layer above the substrate is interesting because the resulting layer is remarkable in regard to the quality of the surface thereof.

A disadvantage of the apparatus is that it is not suitable at all for industrial use. In the manufacture of several layers on several substrates the apparatus would occupy too much space and would not be very easy to use, and the use thereof would require furnaces having several separated heating zones. Moreover, the process is long and difficult.

It is the object of the present invention to provide an industrial apparatus, and in particular an apparatus which can be easily used and by means of which various substrates can be treated simultaneously.

According to the invention, a boat of the kind mentioned in the opening paragraph is characterized in that the reservoirs are provided in a fixed place in the boat in proximity of one end of the boat, and that a fixed flat plate is provided between the base plate and the slide, which flat plate touches the slide with one of its face and contacts the base plate with another face with the plate comprising at least one window and the slide having several communication windows for liquid solutions.

Among the so-called "communication" windows should be noted "admission windows" by means of which the liquid solutions can flow from the reservoirs into the recesses in which the substrates are present, and "discharge" windows by means of which the solutions can leave the recesses.

Leaving the reservoirs in a fixed place in the boat, as provided by the invention, is favourable in the sense that the operation of the slide, when the boat is in a furnace, is less difficult to perform than in the case in which the reservoirs with the liquid solutions also have to be moved. The advantage of fixed reservoirs is more noticeable according to number.

The distribution—admission and discharge—of the liquid solutions is only obtained by the operation of the slide which is moved slightly for each deposit of a layer.

The slide has an admission window and the same number of discharge windows as there are reservoirs. The movements thereof serve to bring the admission window opposite to one of the reservoirs. When all the reservoirs are arranged at one end of the boat, the transition from one reservoir to the next one necessitates only a small movement. The overall amplitude of the movement of the slide then is also small and hence it is not necessary for the slide to project far beyond the boat; this is favourable for the overall occupied space of the apparatus.

In regard to the flat plate, it always comprises at least one discharge window. As will be seen hereinafter with respect to the method of growing with the boat according to the invention, the provision of the admission window below a reservoir brings the discharge window of the plate and the discharge window of the slide opposite to each other. In this manner a passage is formed for removing a liquid solution which has just been used from the recess by stowing under the pressure of the following liquid solution.

In a first embodiment in accordance with the invention the flat plate is above the whole base plate and comprises on the one hand the same number of admission windows as there are reservoirs and on the other hand at least one discharge window. The distances between the discharge window and each of the admission windows in the plate are substantially equal to the distances between the admission window and each of the discharge windows in the slide, respectively. This type of structure with a flat plate which covers the whole base plate is very suitable for the growth of a double layer.

In a second embodiment of a boat in accordance with the invention which is particularly suitable for growing three and more layers, the flat plate is present only partly above the base plate and is not present in the place situated below the reservoirs and comprises only one discharge window. The slide may have an extension which touches the base plate and which, dependent on the position of the slide in the boat, occupies entirely or partly the space present below the reservoirs.

Irrespective of the construction of the boat the discharge window of the plate is preferably situated on the inner edge of the recess in the proximity of that end of the boat which is opposite to the end where the reservoirs are present.

The measures described form a contribution to making from the boat according to the invention an apparatus with which epitaxial deposits of several layers (two, three, four etc.) can be performed in an industrial manner. Providing the reservoirs at one end of the boat has actually the advantage that a large space is left for the recess provided in the base plate: the recess may consequently be made long and several substrates may be provided which are treated simultaneously in identical circumstances. The boat, however, maintains reasonable dimensions, in which the heating zone in the furnaces to be used is narrow, which enables a very accurate control and facilitates the control operation.

The invention also relates to the method of epitaxially growing from the liquid phase several layers by means of the boat according to the invention, which method comprises the steps of providing a first liquid solution originating from the first reservoir at least in the recess in which the substrate bears or the substrates bear, growing a first epitaxial layer on the substrate or the substrates, replacing the first liquid solution by a second liquid solution originating from a second reservoir, growing a second epitaxial layer on the preceding layer, and so on, which method is characterized in that the substrate or the substrates remains remain in a fixed position in the boat, as well as the reservoirs, providing and removing the liquid solutions being associated with the movement of the slide which is placed between the solutions.

Placing the admission window in the slide below a reservoir also has for its result that a discharge window in the slide is moved opposite to the discharge window in the flat plate. Furthermore, when the boat according to this embodiment is used, placing the admission window in the slide below a reservoir also brings the admission window opposite to an admission window of the plate.

The boat according to the invention is suitable for the formation of epitaxial layers on any suitable substrate. Although it has been designed for the growth of III-V materials, in particular GaAlAs, the use thereof is interesting in all cases of growing semiconductor compounds on an industrial scale.

Figure 2:
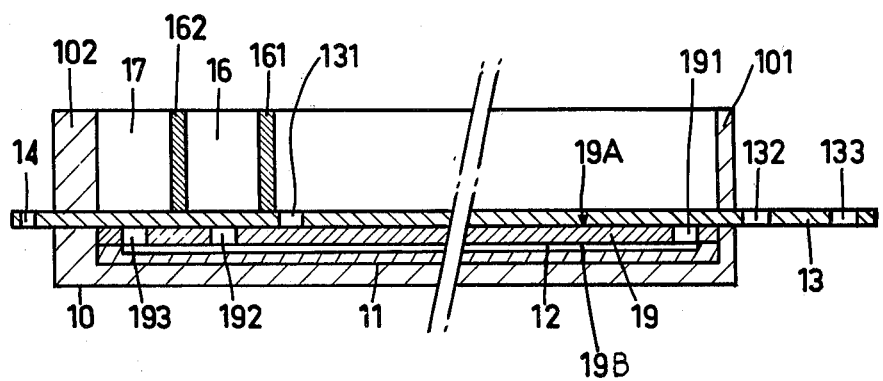
Figure 3:
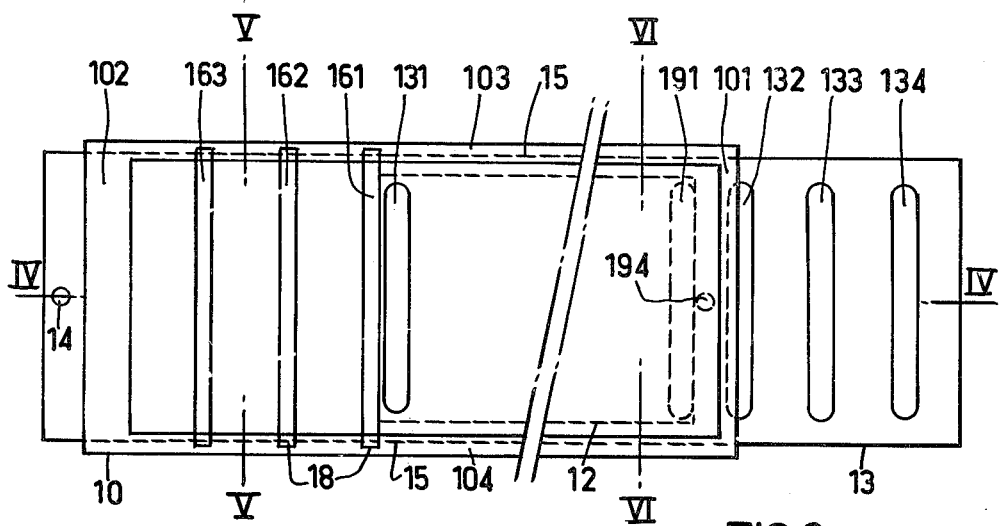
Figure 4:
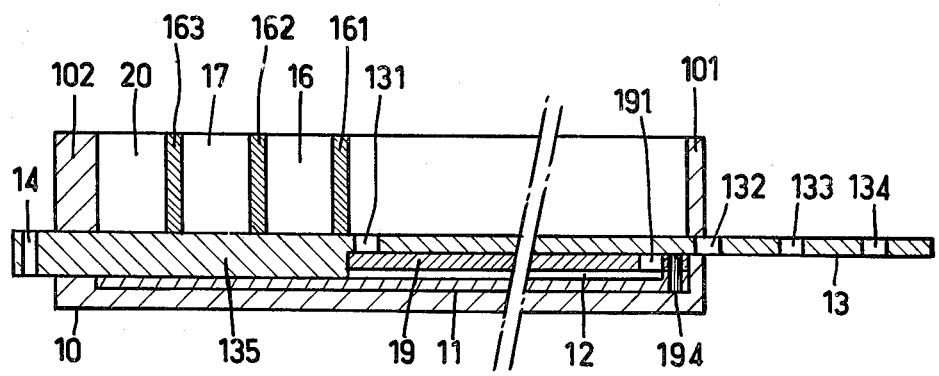
Figure 5:
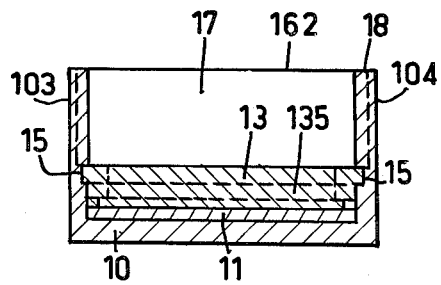
Figure 6:
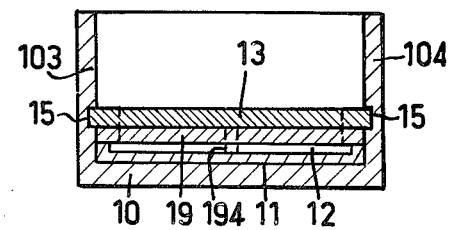

The invention will now be described in greater detail, by way of example, with reference to the accompanying drawing, in which FIG. 1 is a plan view of a boat in a first embodiment which can preferably be used for growing two layers, FIG. 2 is a sectional view taken on the line II—II of FIG. 1, FIG. 3 is a plan view of a boat of a second embodiment which is suitable for the deposition of two layers, FIG. 4 is a longitudinal sectional view taken on the line IV—IV of FIG. 3, FIG. 5 is a cross-sectional view taken on the line V—V of FIG. 3, FIG. 6 is a cross-sectional view taken on the line VI—VI of FIG. 3 and also on the line VI—VI of FIG. 1.

FIGS. 7A to 7D illustrate four successive phases of the process which results in the formation of three epitaxial layers on substrates treated in a boat such as shown in FIGS. 3, 4, 5 and 6.

The boat according to the invention is destined for use in an epitaxial device of a conventional structure known to those skilled in the art and comprising in particular a horizontal space in which the boat is placed, and a heating furnace. The figures only show the boat which is the subject matter of the present invention. In these figures, corresponding elements are referred to by the same reference numerals.

The boat shown in FIGS. 1 and 2 comprises a vessel or crucible 10 in the form of a parallelepiped on the bottom of which a plate 11 is provided. This plate 11 which comprises a recess 12 for receiving semiconductor substrates forms the base plate of the boat; the base plate 11 is connected between the side walls of the crucible 10 and remains in this position. At a distance above the base plate 11 a flat slide 13 is provided which passes through the width walls 101 and 102 of the crucible and which by translation can be moved relative to the crucible (from the right to the left, and vice versa, in the figure; in fact, as will become apparent hereinafter, only a right-left movement is necessary during the growth), for example, by means of a hook engaging in a hole 14 at the end. The plate 13 is preferably guided and held laterally in grooves 15 which are provided in the thickness of the longitudinal walls 103 and 104 of the crucible 10.

The slide 13 supports two reservoirs 16 and 17 which are provided beside each other and serve to receive liquid epitaxial solutions. These two reservoirs have the upper face of the slide 13 at their bottom. Laterally and in the length of the boat they are bounded by the walls 103 and 104 of the crucible. Laterally and in the width of the boat the reservoir 16 is bounded by two partitions 161, 162 bearing on the slides 13, while the reservoir 17 is bounded by the width wall 102 of the crucible and by the partition 162 which thus is common for the two reservoirs 16 and 17. The partitions 161 and 162 are held by vertical grooves 18 provided in the thickness of the walls 103 and 104, So the slide 13 is free in its translation movement relative to the reservoirs 16 and 17.

According to the invention the reservoirs 16 and 17 are provided in a fixed place in the proximity of one end 102 of the boat, the fixed flat plate 19 is placed between the base plate 11 and the slide 13, which fixed plate 19 with one of its side faces 19A contacts the slide 13 and with its other face 19B faces the base plate 11. The plate 19 comprises at least one window 191 and the slide 13 has several communication windows 131, 132, 133 for the liquid solutions.

In the slide 13 the window 131 is the admission window and the windows with 132, 133 are discharge windows, the latter being equal in number to the number of reservoirs and being situated in the part of the slide adjoining the end 101 of the crucible 10.

In the flat plate 19 which in this embodiment extends over the whole length of the boat above the base plate 11, two admission windows 192 and 193 are present and are situated respectively opposite to the reservoirs 16 and 17, and a discharge window 191 is present at the inner edge of the recess 12.

The distances between the discharge window 191 and the admission windows 192 and 193 are substantially equal to the distances in the slide between the admission window 131 and the discharge windows 132 and 133, respectively, so when the window 131 of the slide is moved below the reservoir 16, above the window 192 of the plate, the window 132 comes above the window 191; and in the same manner, when the windows 131 and 193 coincide below the reservoir 17, the windows 133 and 191 also coincide at the other end of the boat.

The discharge window 191 of the plate 19 is situated at the inner edge of the recess 12, to prevent a space from being formed at the right-hand end of the recess from which the solution cannot be removed when the second solution presses the first out of the recess.

As will become apparent hereinafter, the movement of the slide during the epitaxy process is very much restricted and corresponds to a distance in the order of that separating the partition 161 from the wall 102. Hence it is not necessary to have a long slide.

FIGS. 3, 4, 5 and 6 show a boat having three reservoirs which may be used for growing three layers (FIG. 6 is a cross-sectional view of FIG. 3 and, but for a detail, is also a sectional view of FIG. 1). In this boat the same composing elements are present as in the above-described boat. Moreover, a third reservoir 20 is provided which is present between a partition 163 and the wall 102.

The boat having three reservoirs has a specific shape which is characterized by the following points:

First of all the plate 19 which bears on an edge of the base plate 11 does not extend throughout the length of the crucible but only from the wall 101 up to the partition 161, and not over the space present below the reservoirs. Plate 19 has a discharge window 191 but has no admission window. In order to avoid the plate 19 from being moved with the slide, it is connected to the base plate 11, for example, by means of a pin 194. Furthermore, the slide 13 on the left in FIGS. 3 and 4 has an extension 135 which contacts the base plate 11. In the position shown in FIGS. 3 and 4 the extension fills the whole space below the recess and contacts the plate 19 which serves as an abutment (this contact is not indispensible). It extends beyond the crucible 10 and forms the end of the slide in which the hole 14 is provided. Moreover, in addition to admission window 131 the slide 13 has three discharge windows 132, 133, 134 with each of these discharge windows successively corresponding to the discharge window 191 of the plate 19 in various phases of the process.

The components from which the boat is formed, are, for example, of graphite.

The operation of a boat according to the invention will now be described in greater detail with reference to FIG. 7, namely the growth of three layers realized with a boat as shown in FIGS. 3 to 6. Physical or chemical considerations are not considered, such as, for example, the nature of the liquid solution, that of the substrate, the temperature and the time which result in the growth of an epitaxial layer according to methods known to those skilled in the art. The process is studied only with a view to the use of the boat.

Figure 7A:
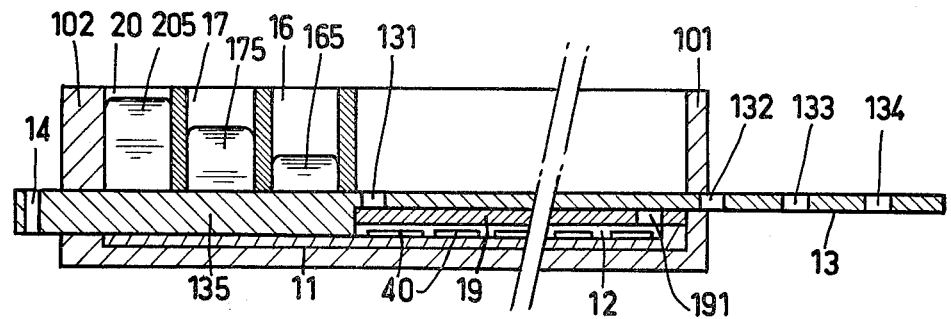
Figure 7B:
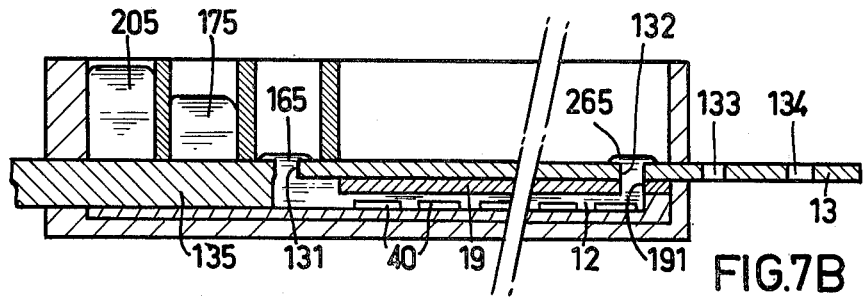
Figure 7C:
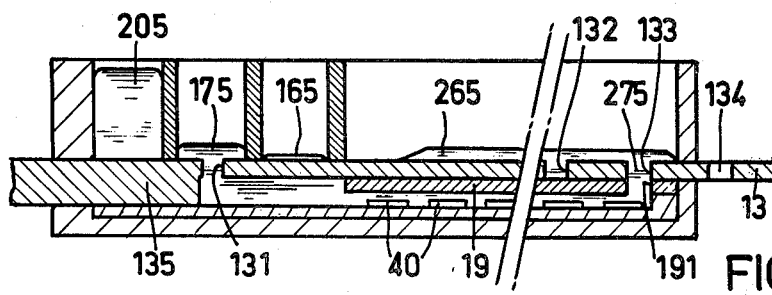

Prior to the growth of the first epitaxial layer the boat assumes the position as shown in FIG. 7A. Multiple substrates 40 are placed in the recess 12. The reservoirs 16, 17 and 20 comprise the first 165, the second 175 and the third 205, respectively, of the liquid solutions. The slide 13 is in such a position that the admission window 131 is present above the plate 19 on the right of the reservoir 16.

In a first step of the process the slide 13 is moved from the right to the left until the window 131 is present opposite to the reservoir 16 in a position in which the discharge window 132 of the slide 13 is present above the discharge window 191 of the plate 19. The liquid solution 165 then flows into the recess 12. The quantity of liquid 165 is sufficient to fill the whole available space and to flow onto the slide 13 at 265 through the windows 191 and 132. The boat then assumes the position shown in FIG. 7B.

After the growth of a first epitaxial layer on the substrates 40 the slide 13 is moved further from the right to the left until the window 131 is present below the second reservoir 17. The solution 175 in the reservoir 17 then flows into the underlying space and occupies the place of the solution 165. The solution 165 is forced onto the slide 13 through the discharge windows 191 and 133 (see FIG. 7C), some solution 175 also flowing onto the slide at 275. The growth of the second epitaxial layer may then be started.

Figure 7D:
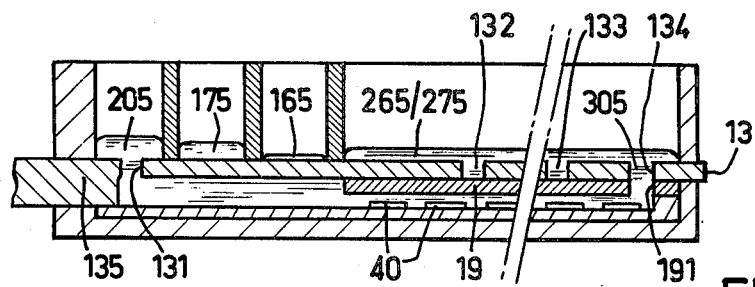

In a third step of the process the slide 13 is moved still further from the right to the left so as to bring the admission window 131 below the third reservoir 20. At the same time the reservoir 17 is closed and the discharge window 134 comes above the discharge window 191. Then it is the turn of the third liquid solution 205 to come in contact with the substrate 40; and the solution 205 then takes the place of the solution 175 which is driven back through the aperture 191-134 onto the slide 13 where a small quantity of solution 205 itself also flows at 305 (FIG. 7D). The third epitaxial layer may then be grown.

In FIGS. 1 to 4 the reservoirs are shown to have substantially the same capacity. This is not absolutely necessary, since the increase of the space to be filled, inasmuch as the extension 135 retracts, may necessitate differences in capacity, and differences in size, between the reservoirs.

In order to ensure that the second solution 175, when it is present in the recess 12, is not contaminated by retroflows of first solution 165 forced back onto the plate 13 (FIG. 7C), the slide 13 can be moved slightly to the left as soon as the epitaxial deposit of the second layer starts so that the connection through the window 133 and 191 is interrupted. This movement, of course, must be smaller than that which is necessary to bring the window 131 below the third reservoir 20.

Contamination of the first solution flowed in the recess can be prevented in a similar manner.

It is to be noted that the slide 13 is moved in a single sense (from right to left in the FIG. 7) and that the amplitude of the movement is very small so that the length of a slide can be small.

The above-described example is restricted to the growth of three layers but it will be obvious that the boat may be constructed for growing a larger number of layers.

The boat shown in FIGS. 1 and 2, as compared with the boat shown in FIGS. 3 and 4, shows the advantage that, since the plate 19 extends over the whole length of the boat, the recess 12 has a constant volume irrespective of the position of the slide in the boat. The volume of the recess 12 becomes larger in the boat shown in FIGS. 3 and 4 when the extension 135 is moved to the left. From this a smaller need of liquid solution follows in the first embodiment (FIGS. 1 and 2) than in the second embodiment (FIGS. 3 and 4) with the dimensions of the boats remaining substantially the same.

What is claimed is:

1. A boat for epitaxial growth from the liquid phase of successive semiconductor layers on at least one semiconductor substrate, said boat comprising a fixed base plate having a recessed surface for supporting at least one substrate, a flat slide provided above said fixed base plate, said slide being movable through a wall of the boat over said base plate, at least one reservoir containing liquid solution for epitaxial growth and being fixed at one end of said boat, said slide supporting said liquid solution in said reservoir, and a fixed flat plate placed between said base plate and said slide, said flat plate having at least one window through its surface, said slide having a plurality of communication windows through its surface for respectively admitting said liquid solution to said substrate and discharging said liquid solution from said substrate.

2. A boat according to claim 1, wherein a plurality of said reservoirs are provided, and wherein said slide has a single admission window and the same number of discharge windows as the number of said reservoirs.

3. A boat according to one of claims 1 or 2, wherein said fixed flat plate extends over the entire base plate, and wherein said flat plate has an equal number of windows as the number of said reservoirs at one end of said flat plate and a single window at an opposite end of said flat plate.

4. A boat according to claim 3, wherein said windows in said flat plate are separated at the same distance as said communication windows of said slide.

5. A boat according to claim 3, wherein said single window of said flat plate is provided for discharging liquid solution from said substrate, and is located approximately at the end of said boat opposite to said reservoirs.

6. A boat according to claim 3, wherein said slide provides the bottom surface of said reservoir, and said slide is movable relative to said reservoir.

7. A boat according to one of claims 1 or 2, wherein said flat plate is only located over said base plate at areas free of said reservoir, and wherein said flat plate only has one window for discharging said liquid solution from said substrate.

8. A boat according to claim 7, wherein said slide has an extension adjacent to said base plate at least below said reservoir.

* * * * *